(12) United States Patent
Lee et al.

(10) Patent No.: US 8,963,251 B2
(45) Date of Patent: Feb. 24, 2015

(54) SEMICONDUCTOR DEVICE WITH STRAIN TECHNIQUE

(71) Applicant: Taiwan Semiconductor Manufacturing Company, Ltd., Hsin-Chu (TW)

(72) Inventors: Tung Ying Lee, Hsinchu (TW); Yu-Lien Huang, Jhubei (TW); Chung-Hsien Chen, Taipei (TW); Chi-Wen Liu, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/916,066

(22) Filed: Jun. 12, 2013

(65) Prior Publication Data
US 2014/0367800 A1    Dec. 18, 2014

(51) Int. Cl.
*H01L 29/66* (2006.01)
*H01L 29/78* (2006.01)
*H01L 21/8234* (2006.01)
*H01L 29/10* (2006.01)
*H01L 27/12* (2006.01)

(52) U.S. Cl.
CPC .... *H01L 29/7849* (2013.01); *H01L 21/823412* (2013.01); *H01L 21/823431* (2013.01); *H01L 29/1054* (2013.01); *H01L 27/12* (2013.01); *H01L 27/1203* (2013.01); *H01L 29/66795* (2013.01)

USPC .......................................... 257/353; 438/164

(58) Field of Classification Search
CPC .............. H01L 27/12; H01L 29/66795; H01L 27/1203
USPC .......................................... 257/353; 438/164
See application file for complete search history.

(56) References Cited

U.S. PATENT DOCUMENTS

| | | | |
|---|---|---|---|
| 2012/0313151 A1* | 12/2012 | Lee ................................ | 257/288 |
| 2014/0035041 A1* | 2/2014 | Pillarisetty et al. ........... | 257/365 |
| 2014/0054546 A1* | 2/2014 | Liu et al. ......................... | 257/24 |

* cited by examiner

*Primary Examiner* — Phat X Cao
(74) *Attorney, Agent, or Firm* — Haynes and Boone, LLP

(57) ABSTRACT

The present disclosure provides a semiconductor device. The semiconductor device includes a substrate, a fin structure disposed over the substrate in the gate region. The fin structure includes a first semiconductor material layer as a lower portion of the fin structure, a semiconductor oxide layer as a middle portion of the fin structure and a second semiconductor material layer as an upper portion of the fin structure. The semiconductor device also includes a dielectric feature disposed between two adjacent fin structures over the substrate. A top surface of the dielectric feature located, in a horizontal level, higher than the semiconductor oxide layer with a distance d. The semiconductor device also includes a high-k (HK)/metal gate (MG) stack disposed in the gate region, including wrapping over a portion of the fin structure.

24 Claims, 15 Drawing Sheets

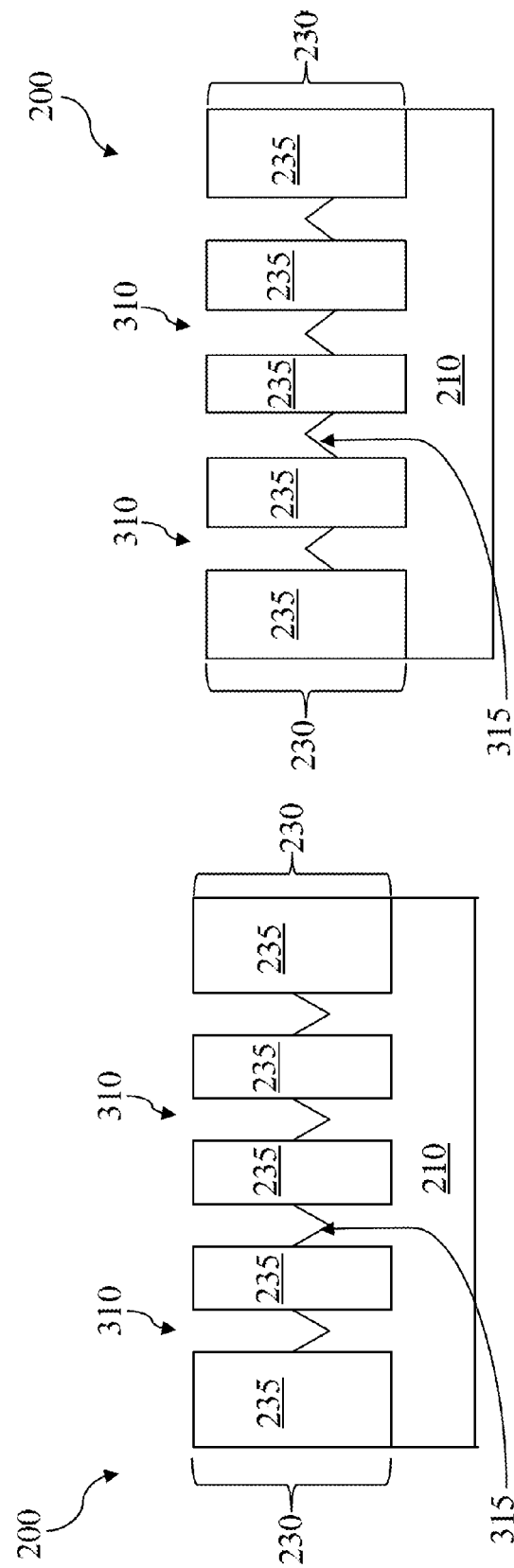

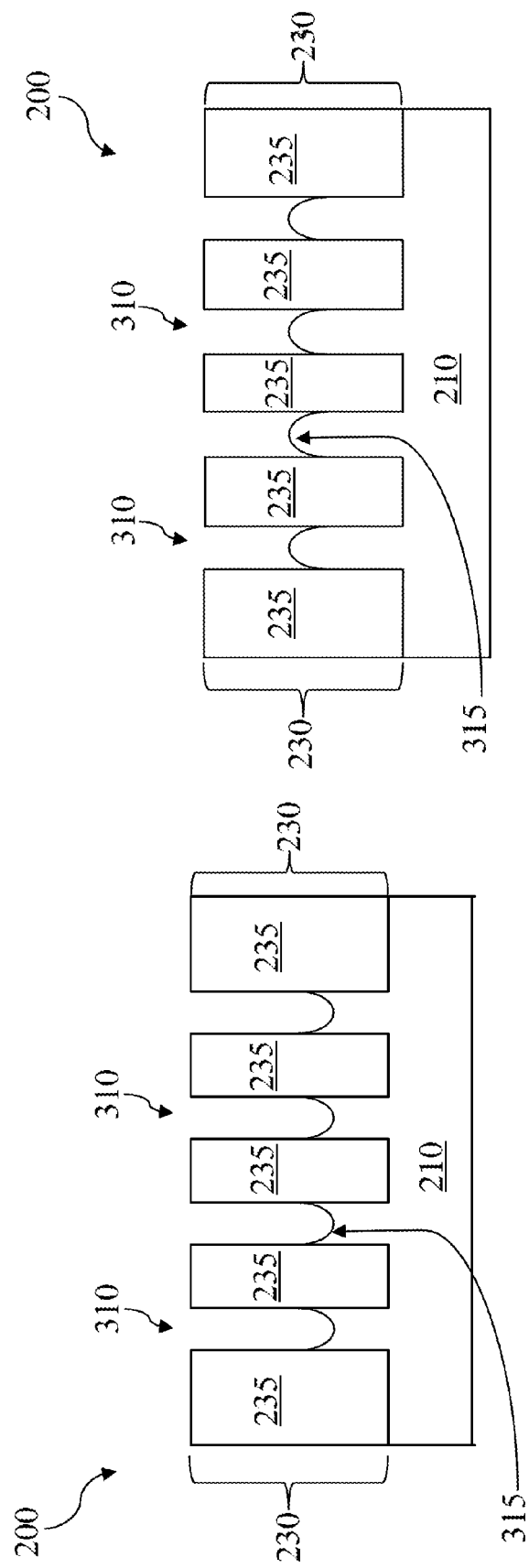

SEMICONDUCTOR DEVICE WITH STRAIN TECHNIQUE

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, a three dimensional transistor, such as a fin-like field-effect transistor (FinFET), has been introduced to replace a planar transistor. Although existing FinFET devices and methods of fabricating FinFET devices have been generally adequate for their intended purposes, they have not been entirely satisfactory in all respects. Improvements in this area are desired.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2B, 3A-3E, 4A-4B and 5 are cross-sectional views of an example semiconductor device along line A-A in FIG. 2A at fabrication stages constructed according to the method of FIG. 1.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

The present disclosure is directed to, but not otherwise limited to, a FinFET device. The FinFET device, for example, may be a complementary metal-oxide-semiconductor (CMOS) device comprising a P-type metal-oxide-semiconductor (PMOS) FinFET device and an N-type metal-oxide-semiconductor (NMOS) FinFET device. The following disclosure will continue with a FinFET example to illustrate various embodiments of the present invention. It is understood, however, that the application should not be limited to a particular type of device, except as specifically claimed.

Figure 1:
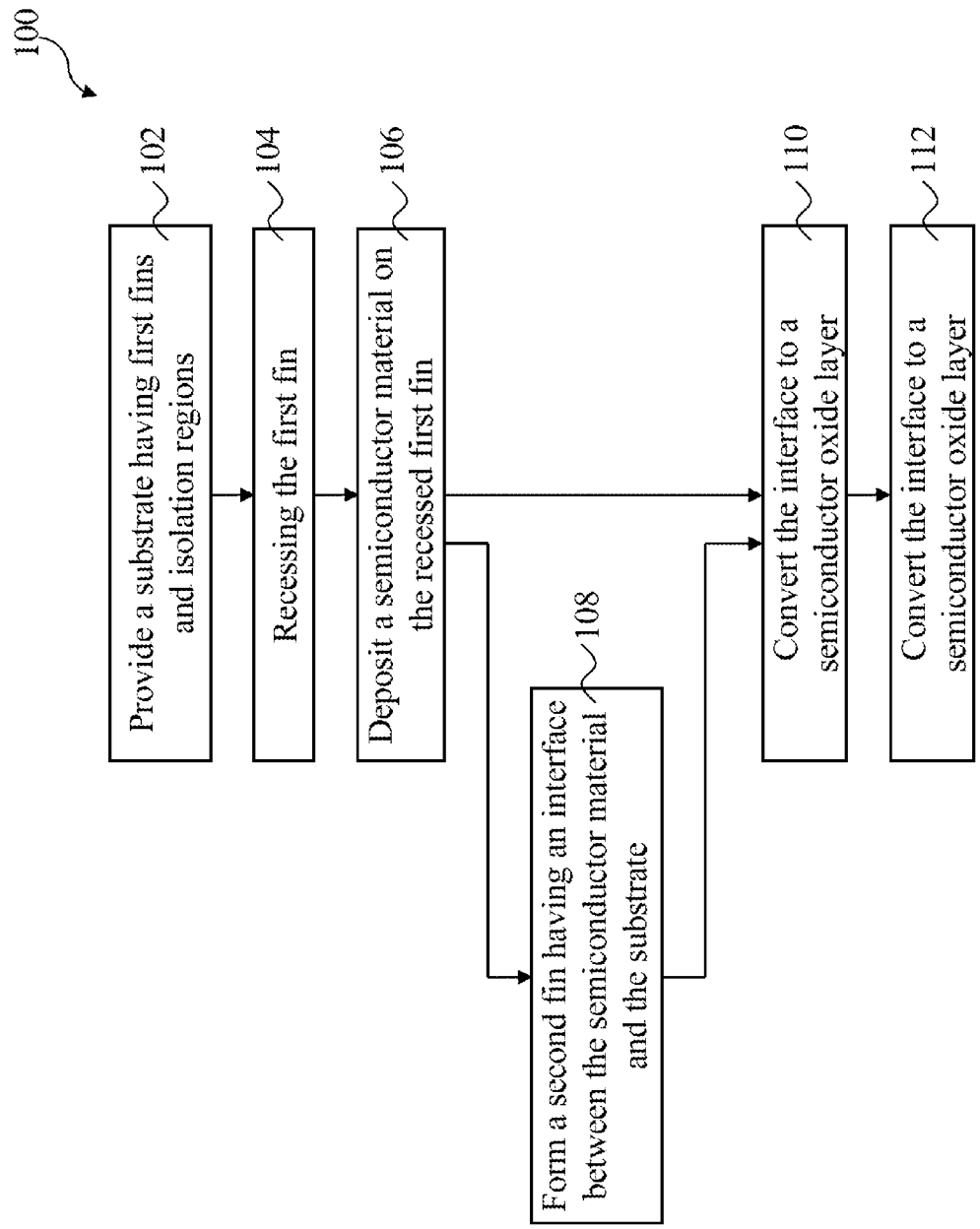
FIG. 1 is a flow chart of an example method for fabricating a semiconductor device according to various aspects of the present disclosure.

FIG. 1 is a flowchart of a method 100 for fabricating a semiconductor device according to aspects of the present disclosure. It is understood that additional steps can be provided before, during, and after the method, and some of the steps described can be replaced or eliminated for other embodiments of the method. The disclosure also discusses several different embodiments of an IC device 200, as shown in FIGS. 2A-2B, 3A-3E, 4A-4B, 5, 6, 7A-7B, 8A-8B and 9 manufactured according to the method 100. The present disclosure repeats reference numerals and/or letters in the various embodiments. This repetition is for the purpose of simplicity and clarity and does not in itself dictate a relationship between the various embodiments and/or configurations discussed.

Figure 2A:
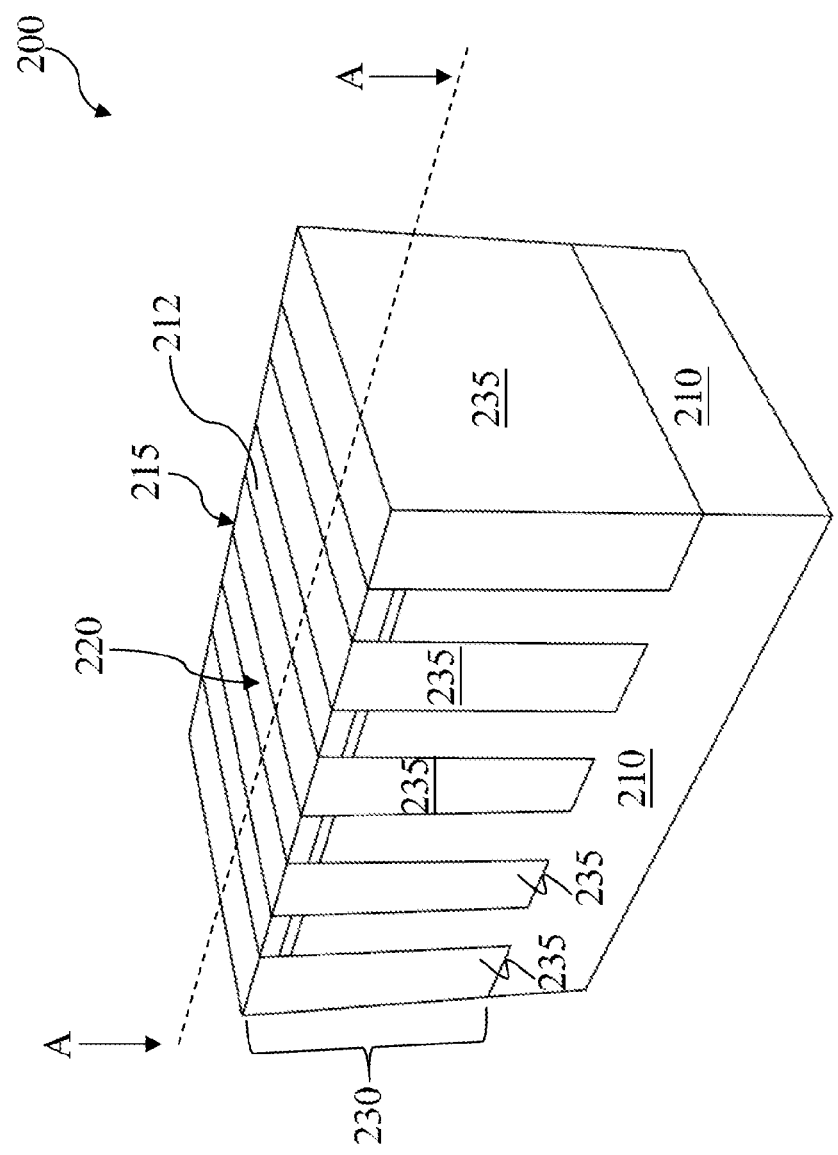
FIG. 2A is a diagrammatic perspective view of a semiconductor device undergoing processes according to an embodiment of the present disclosure.

FIG. 2A is a diagrammatic perspective view of a first embodiment of an IC device 200 undergoing processes according to the method of FIG. 1.

FIGS. 2B, 3A-3E, 4A-4B and 5 are cross-sectional views of an example of the IC device 200 along line A-A in FIG. 2A.

Figure 6:
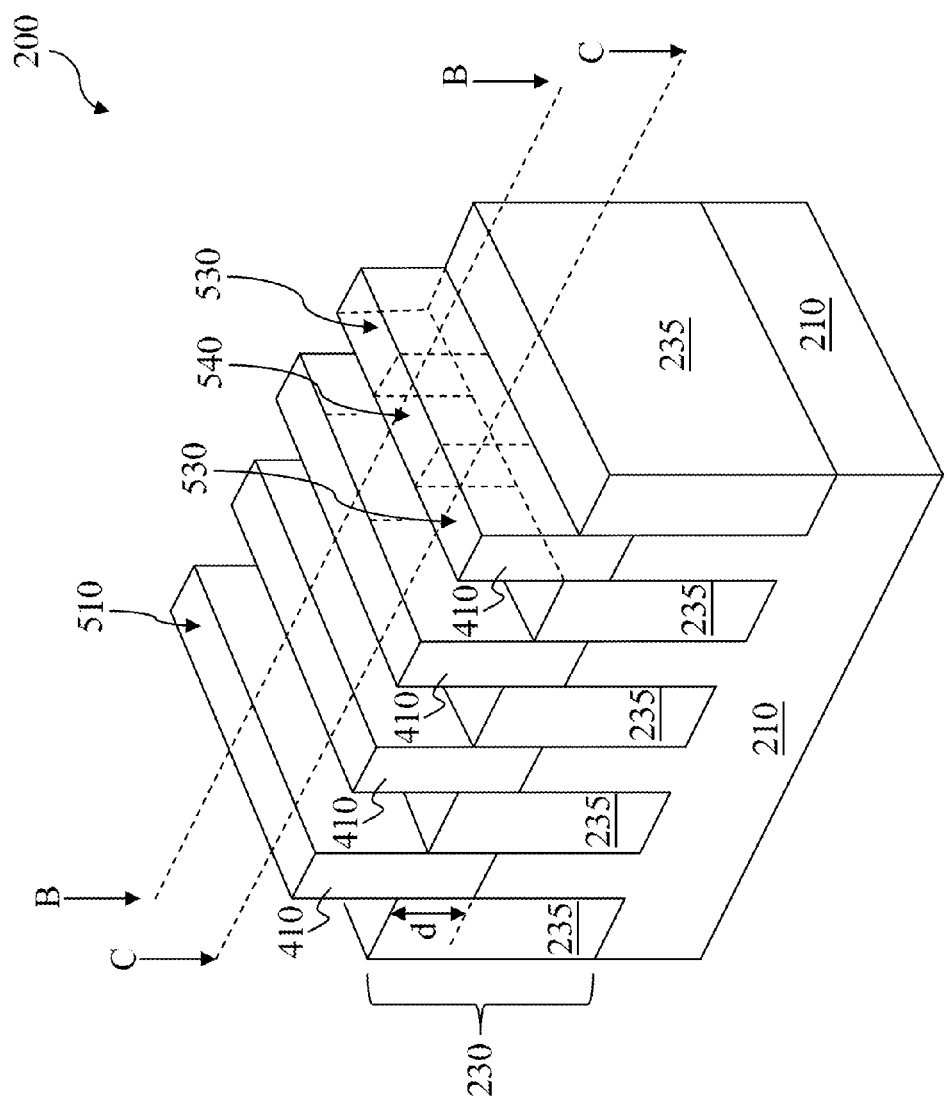
FIG. 6 is a diagrammatic perspective view of a semiconductor device undergoing processes according to an embodiment of the present disclosure.

FIG. 6 is a diagrammatic perspective view of another embodiment of an IC device 200 undergoing processes according to an embodiment according to the method of FIG. 1.

Figure 7A:
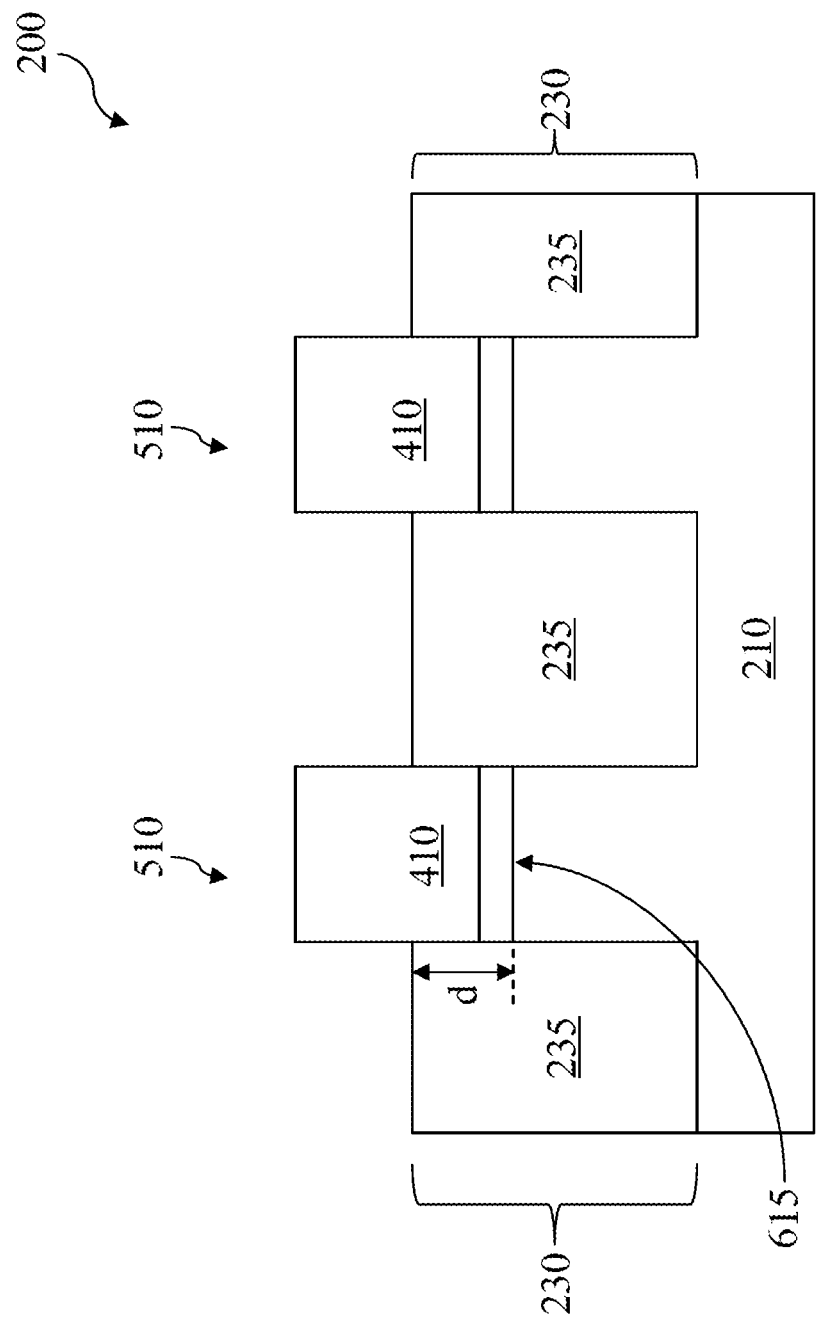
FIGS. 7A-7B and 8A are cross-sectional views of an example semiconductor device along line B-B in FIG. 6 at fabrication stages constructed according to the method of FIG. 1.
Figure 7B:
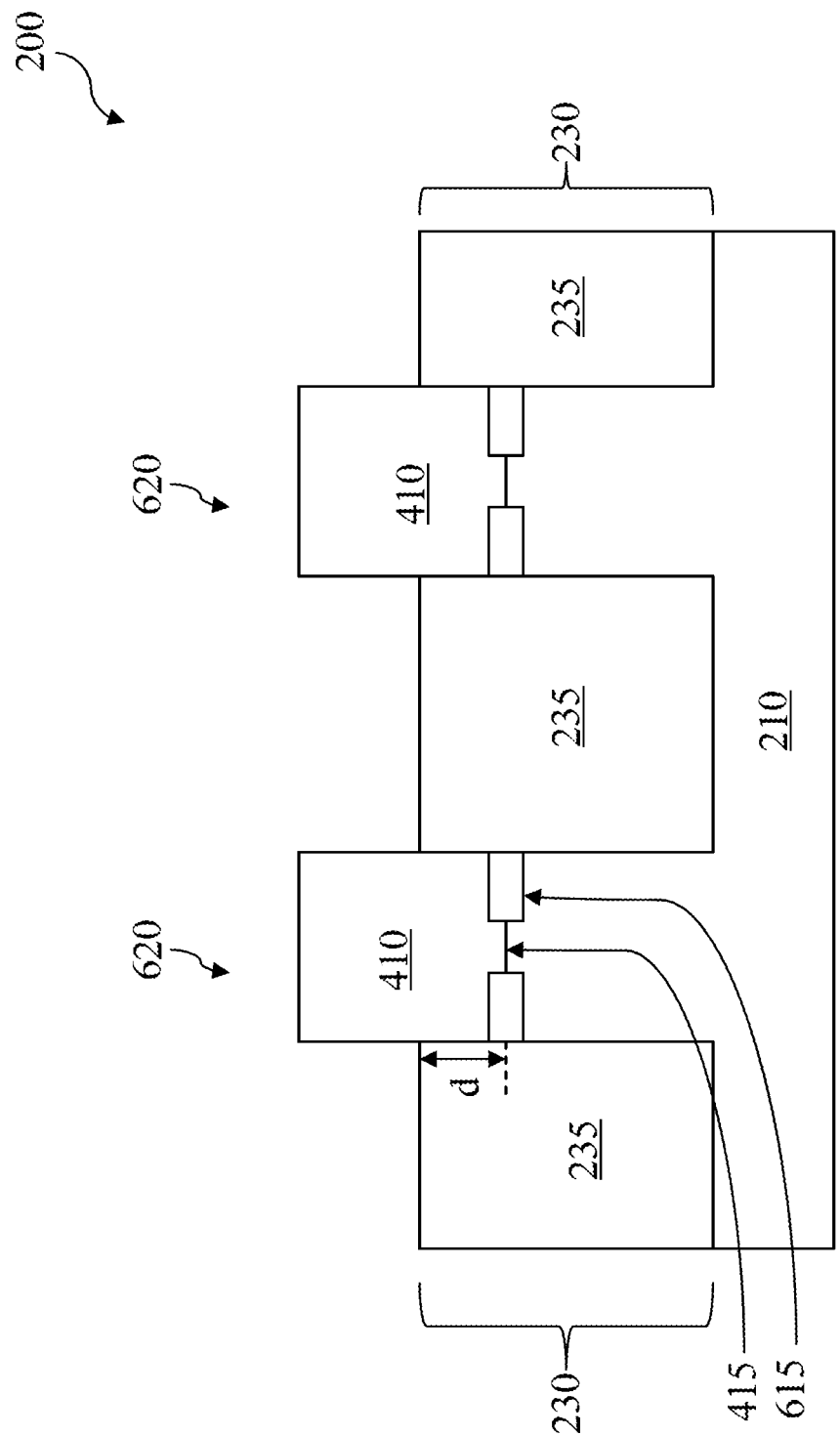
Figure 8A:
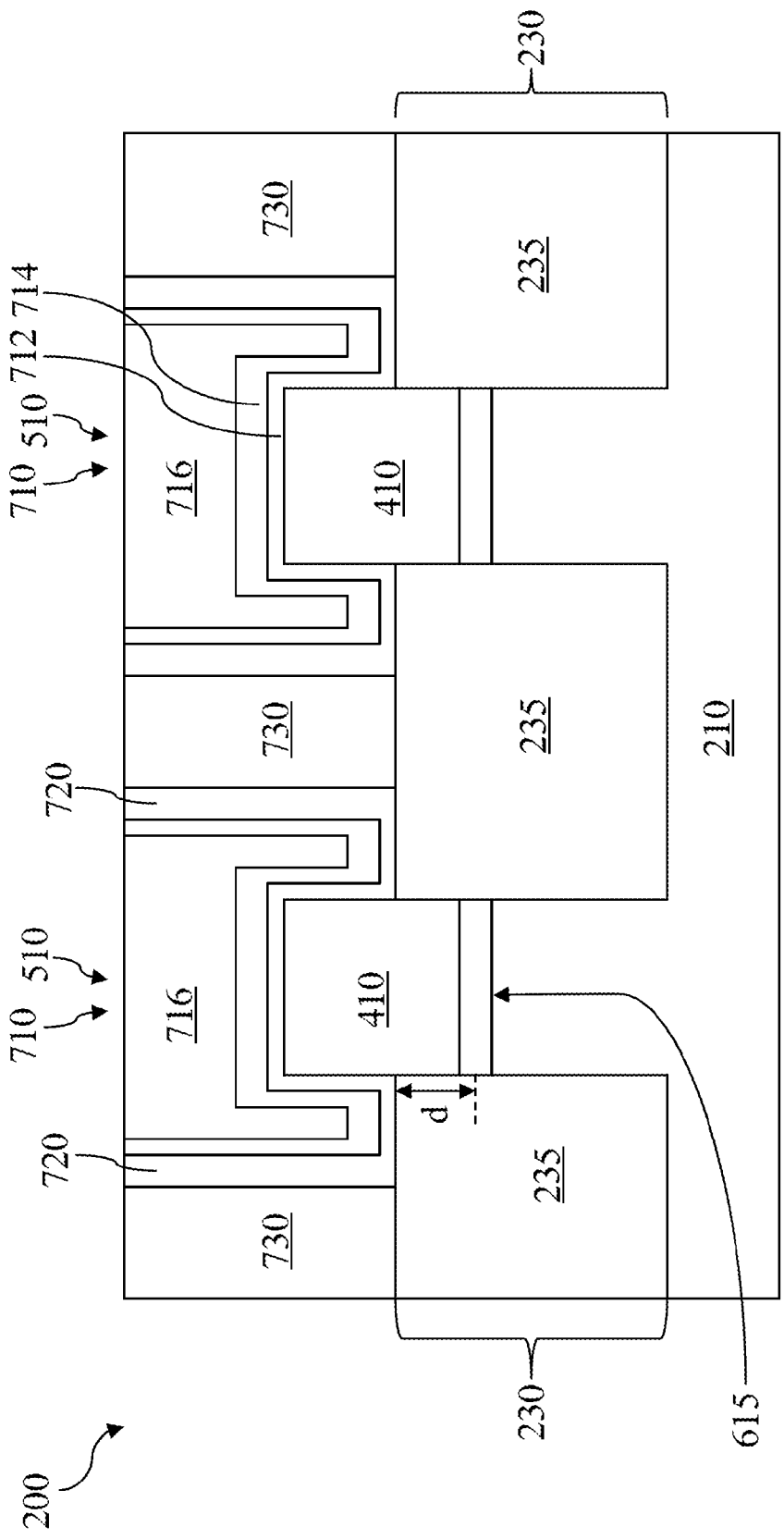
Figure 8B:
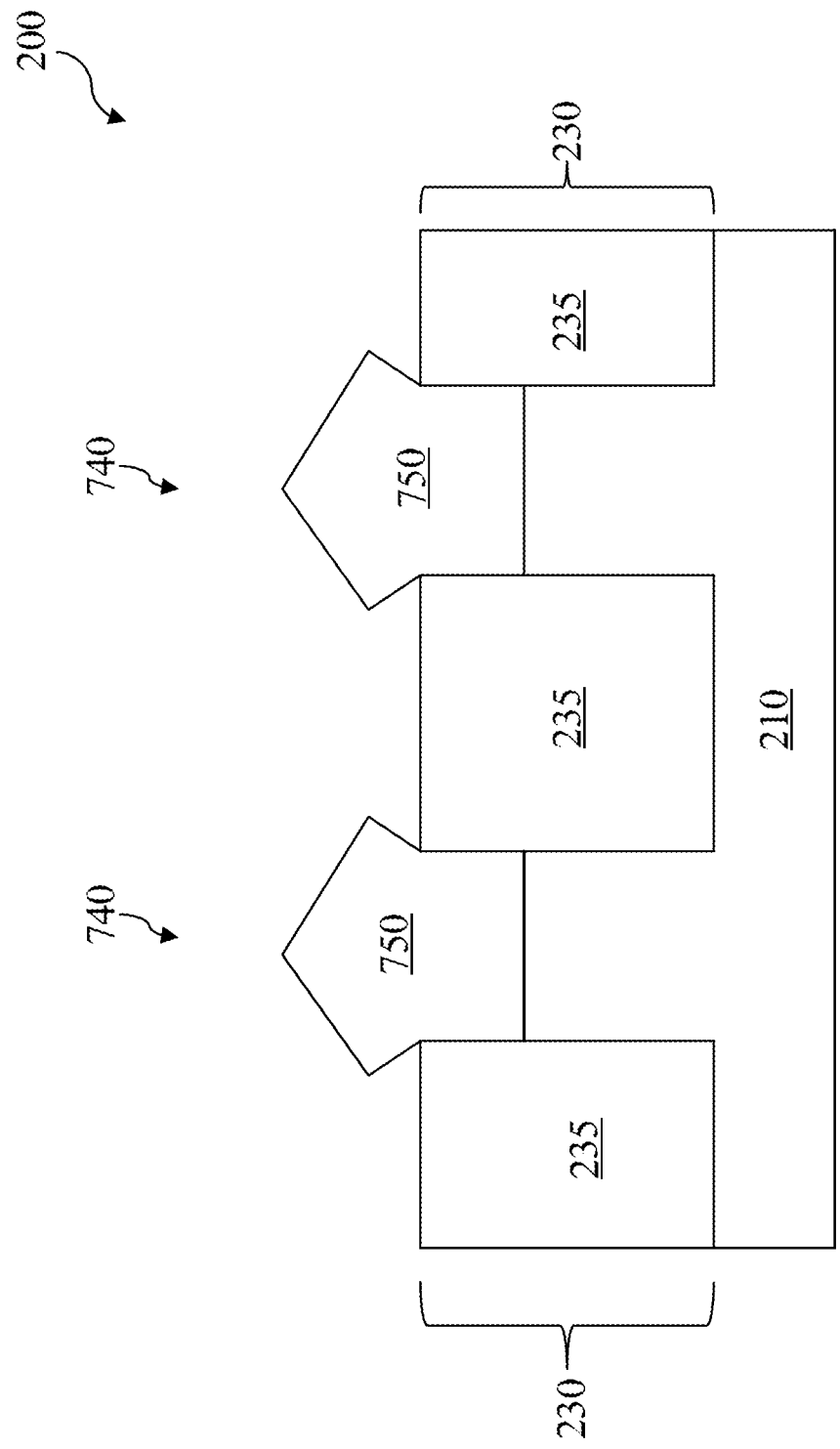
FIG. 8B is a cross-sectional view of an example semiconductor device along line C-C in FIG. 6 at fabrication stages constructed according to the method of FIG. 1.

FIGS. 7A-7B and 8A are cross-sectional views of the IC device 200 of FIG. 6 along line B-B; and FIG. 8B is a cross-sectional view of the semiconductor device along line C-C. The line B-B is parallel to the line C-C.

Figure 9:
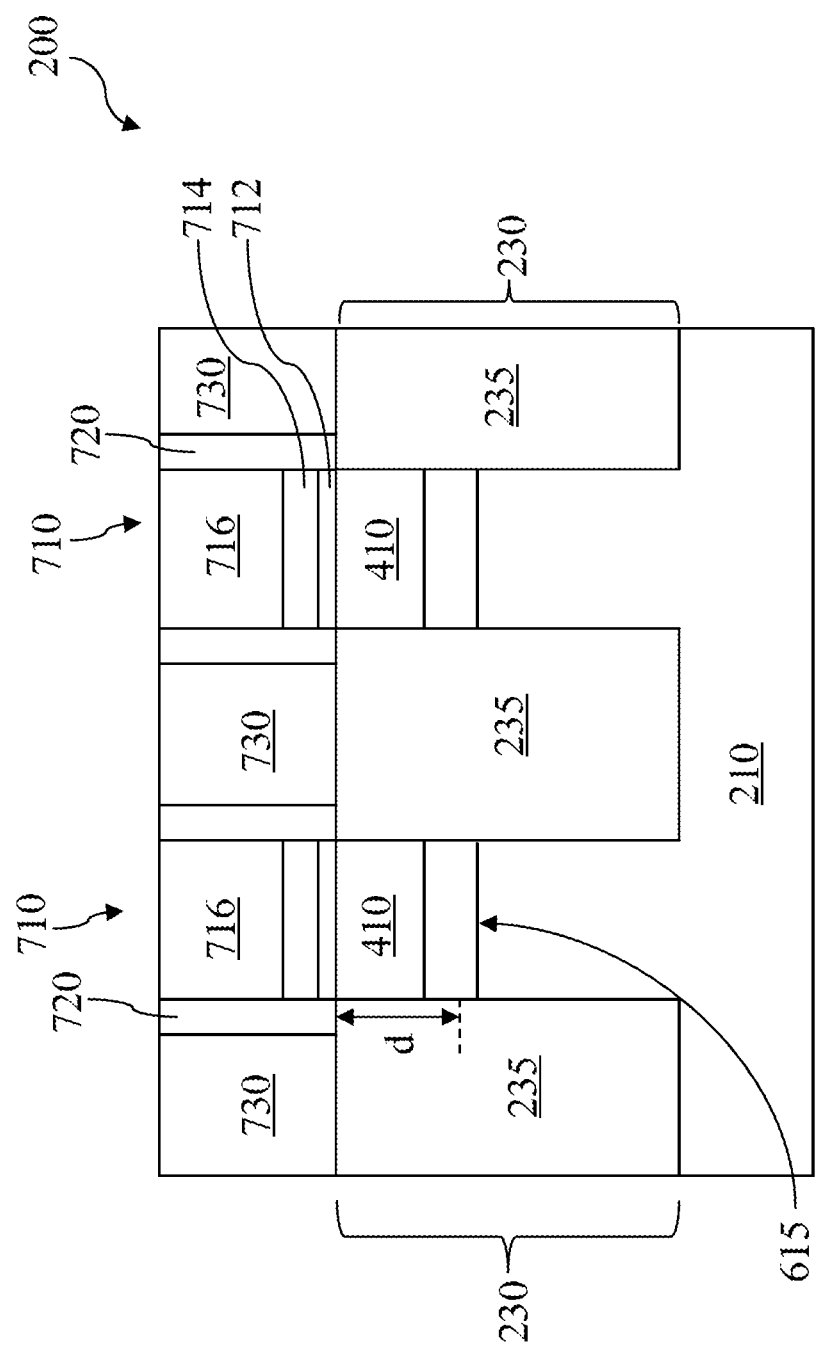
FIG. 9 is a cross-sectional view of an example semiconductor device along line A-A line in FIG. 2A at fabrication stages constructed according to the method of FIG. 1.

FIG. 9 is a cross-sectional view of the IC device 200 of FIG. 2A along line A-A.

Figure 2B:
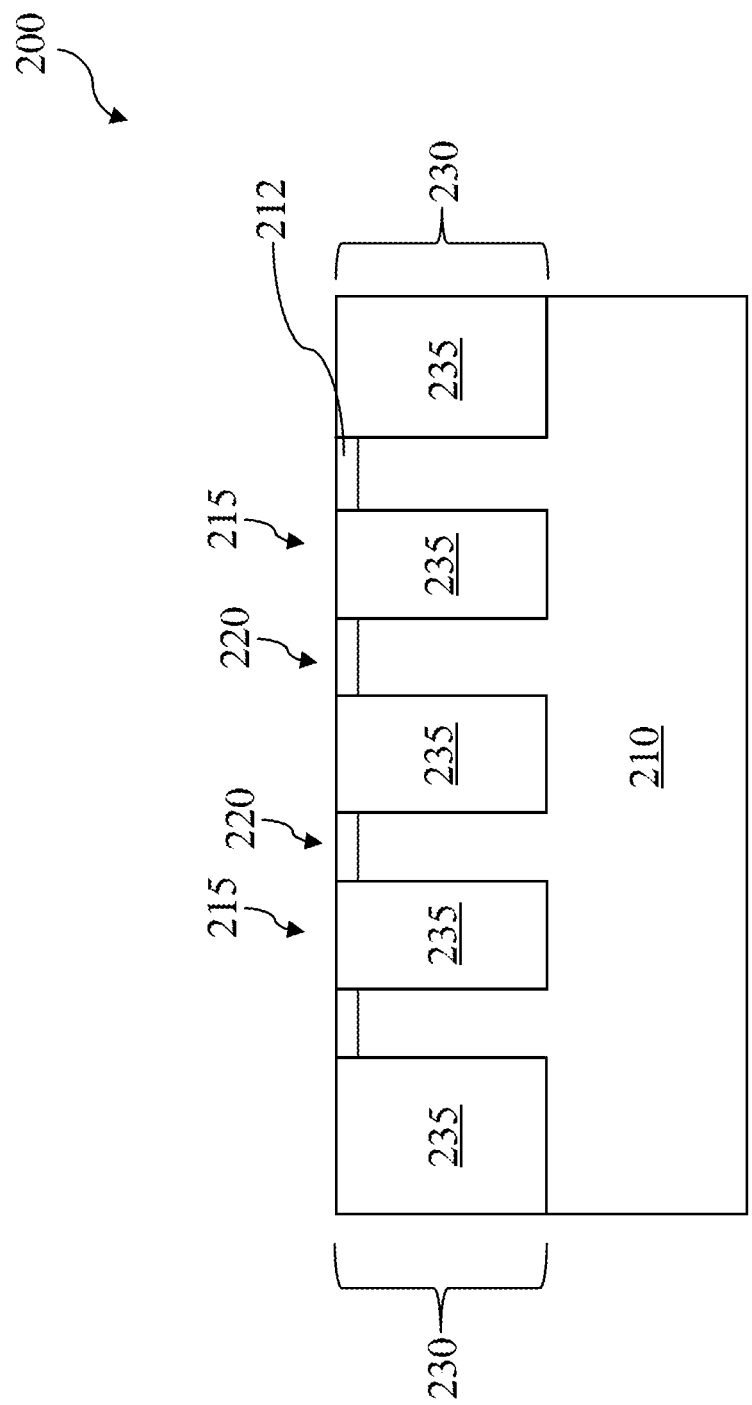
Figure 3A:
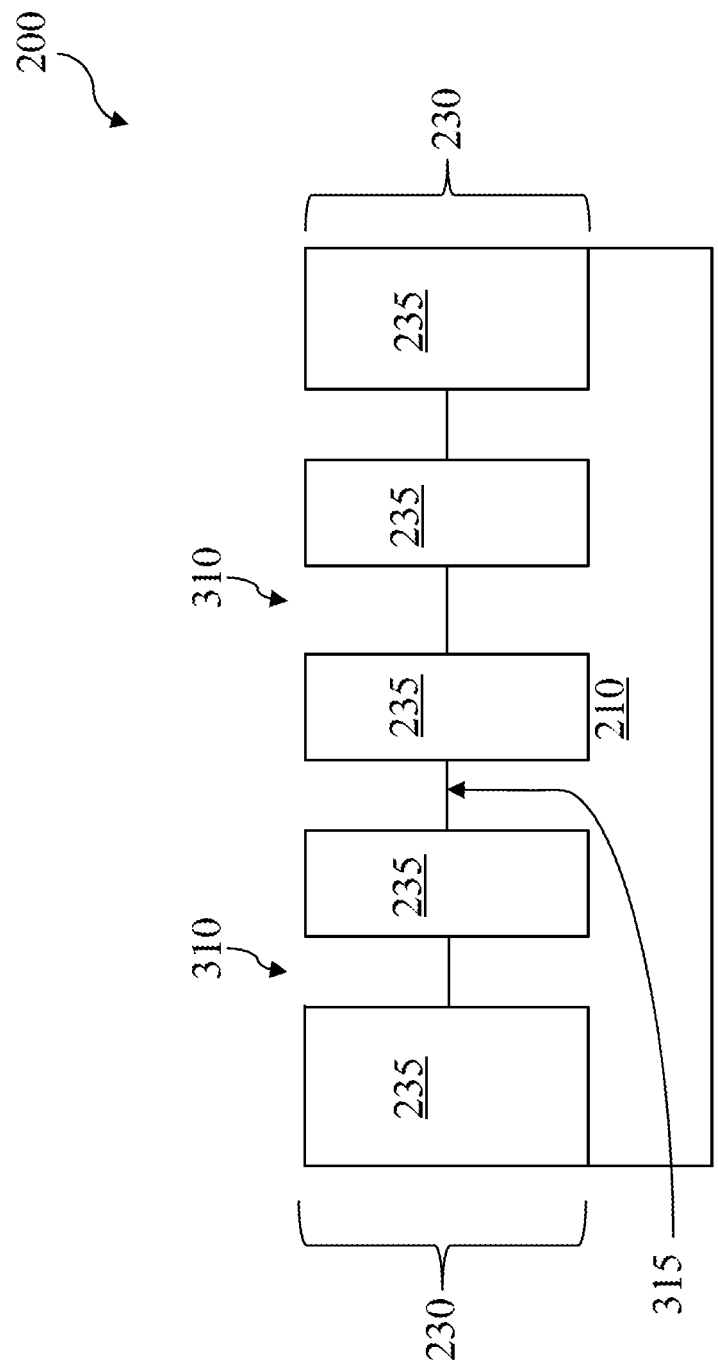

Referring to FIGS. 1 and 2A-2B, the method 100 begins at step 102 by providing a substrate 210. In the present embodiment, the substrate 210 is a bulk silicon substrate. Alternatively, the substrate 210 may include an elementary semiconductor, such as silicon or germanium in a crystalline structure; a compound semiconductor, such as silicon germanium, silicon carbide, gallium arsenic, gallium phosphide, indium phosphide, indium arsenide, and/or indium antimonide; or combinations thereof. Possible substrates 210 also include a silicon-on-insulator (SOI) substrate. SOI substrates are fabricated using separation by implantation of oxygen (SIMOX), wafer bonding, and/or other suitable methods.

Some exemplary substrates 210 also include an insulator layer. The insulator layer comprises any suitable material, including silicon oxide, sapphire, and/or combinations thereof. An exemplary insulator layer may be a buried oxide layer (BOX). The insulator is formed by any suitable process, such as implantation (e.g., SIMOX), oxidation, deposition, and/or other suitable process. In some exemplary semiconductor precursors, the insulator layer is a component (e.g., layer) of a silicon-on-insulator substrate.

The substrate 210 may include various doped regions depending on design requirements as known in the art. The doped regions may be doped with p-type dopants, such as boron or BF2; n-type dopants, such as phosphorus or arsenic; or combinations thereof. The doped regions may be formed directly on the substrate 210, in a P-well structure, in an N-well structure, in a dual-well structure, or using a raised structure. The substrate 210 may further include various active regions, such as regions configured for an N-type metal-oxide-semiconductor transistor device and regions configured for a P-type metal-oxide-semiconductor transistor device.

A first fin 220 is formed over the substrate 210. In some embodiments, the substrate 210 includes more than one first fin 220. The first fin 220 is formed by any suitable process including various deposition, photolithography, and/or etching processes. As an example, the first fin 220 is formed by patterning and etching a portion of the silicon substrate 210, referred to as first trenches 215. In another example, the first fin 220 is formed by patterning and etching a silicon layer deposited overlying an insulator layer (for example, an upper silicon layer of a silicon-insulator-silicon stack of an SOI substrate. Additionally, a first hard mask layer 212 is deposited over the substrate 210 prior to patterning and etching processes. The first hard mask layer 212 includes silicon oxide, silicon nitride, silicon oxynitride, or any other suitable dielectric material. The first hard mask layer 212 may be a single layer or multiple layers. The first hard mask layer 212 can be formed by thermal oxidation, chemical oxidation, atomic layer deposition (ALD), or any other appropriate method. It is understood that multiple parallel first fins 220 may be formed in a similar manner.

Various isolation regions 230 are formed in or on the substrate 210. The isolation regions 230 may be formed using traditional isolation technology, such as shallow trench isolation (STI), to define and electrically isolate the various regions. As one example, the formation of an STI includes filling the first trench 215 (for example, by using a chemical vapor deposition process) with one or more dielectric layers 235. The dielectric material includes silicon oxide, silicon nitride, silicon oxynitride, or other suitable materials, or combinations thereof. In some examples, the filled first trench 215 may have a multi-layer structure such as a thermal oxide liner layer filled with silicon nitride or silicon oxide.

Additionally, a chemical mechanical polishing (CMP) process is performed to remove excessive dielectric layer 235 and planarize the top surface of the isolation regions 230 with the top surface of the first fin 220. In one embodiment, the CMP process removes the first hard mask 212 as well.

Referring to FIGS. 1 and 3A-3E, the method 100 proceeds to step 104 by recessing the first fins 220 to form second trenches 310. The recessing process may include a dry etching process, a wet etching process, and/or a combination thereof. A wet etching process can use solutions such as tetramethylammonium hydroxide (TMAH), a HF/HNO3/CH3COOH solution, NH$_4$OH, KOH (potassium hydroxide), HF (hydrofluoric acid), or other suitable solution. A dry etching process can include a plasma etching process that uses a chlorine-based chemistry. Other dry etchant gasses include $CF_4$, $NF_3$, $SF_6$, and He. Dry etching may include transformer coupled plasma (TCP) etch, electron cyclotron resonance (ECR) etch and reactive ion etch (RIE). The dry and wet etching processes have etching parameters that can be tuned, such as etchants used, etching temperature, etching solution concentration, etching pressure, source power, RF bias voltage, RF bias power, etchant flow rate, and other suitable parameters. A various bottom profile 315 may be achieved by different etching process and/or different combinations of dry and wet etching process. The bottom profile 315 includes flat, V-shape, upside-down V-shape (hereinafter referred to as a carrot-shape), concave and convex, as shown in FIGS. 3A-3E, respectively. The bottom profile 315 also includes a wavy-shape (not illustrated).

As an example, a flat bottom profile 315 may be achieved by TCP etch using a chlorine-base chemistry. As another example, a V-shape bottom profile 315 may be achieved by a TCP etch using a chlorine-base chemistry and followed by a wet etch, such as TMAH. As yet another example, a carrot-shape) bottom profile 315 may be achieved by a TCP etch with an appropriate high bias voltage. The following disclosure will be directed to the embodiment of FIG. 3A, for the sake of example. It is understood that similar steps can be implemented on the embodiments of FIG. 3B-3E.

Figure 4A:
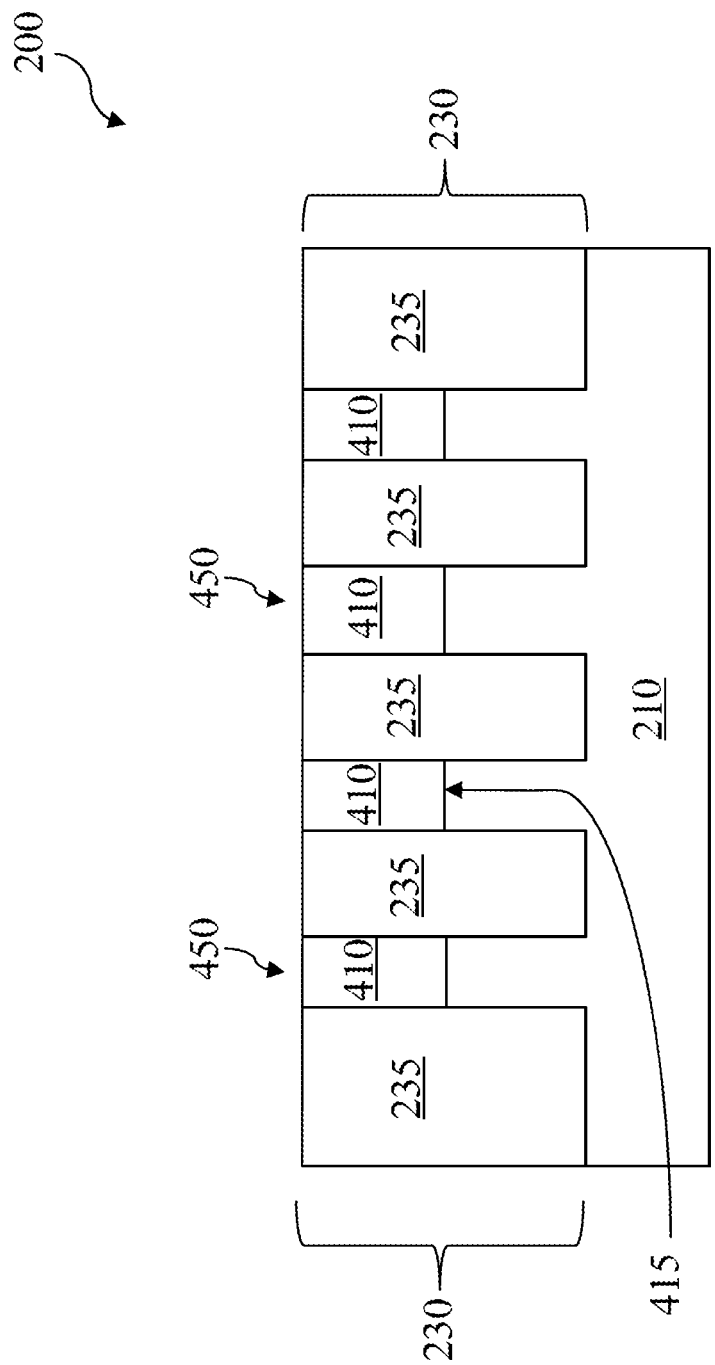

Referring to FIGS. 1 and 4A, the method 100 proceeds to step 106 by depositing a semiconductor material layer 410, which is a different material than the substrate 210, to fill in the second trenches 310. At the bottom of the second trench 310, an interface 415 of the semiconductor material layer 410 and the substrate 210 is formed thereof. A profile of the interface 415 may be substantially similar to the bottom profile 315. The semiconductor material layers 410 may be deposited by epitaxial growing processes. The epitaxial processes include chemical vapor deposition (CVD) deposition techniques (e.g., vapor-phase epitaxy (VPE) and/or ultra-high vacuum CVD (UHV-CVD)), molecular beam epitaxy, and/or other suitable processes. The semiconductor material layer 410 may include germanium (Ge), silicon (Si), gallium arsenide (GaAs), aluminum gallium arsenide (AlGaAs), silicon germanium (SiGe), gallium arsenide phosphide (GaAsP), or other suitable materials. In one embodiment, the semiconductor material layer 410 is SiGe, the substrate 210 is Si and the interface 415 is SiGe/Si. Additionally, a CMP process may be performed to remove excessive semiconductor material layers 410 and planarize top surfaces of the semiconductor material layer 410 and the isolation region 230 to form a second fin structure 450. In present embodiment, the second fin structure 450 has the substrate 210 as a lower portion, the interface 415 as a middle portion and the semiconductor material layer 410 as an upper portion.

Figure 4B:
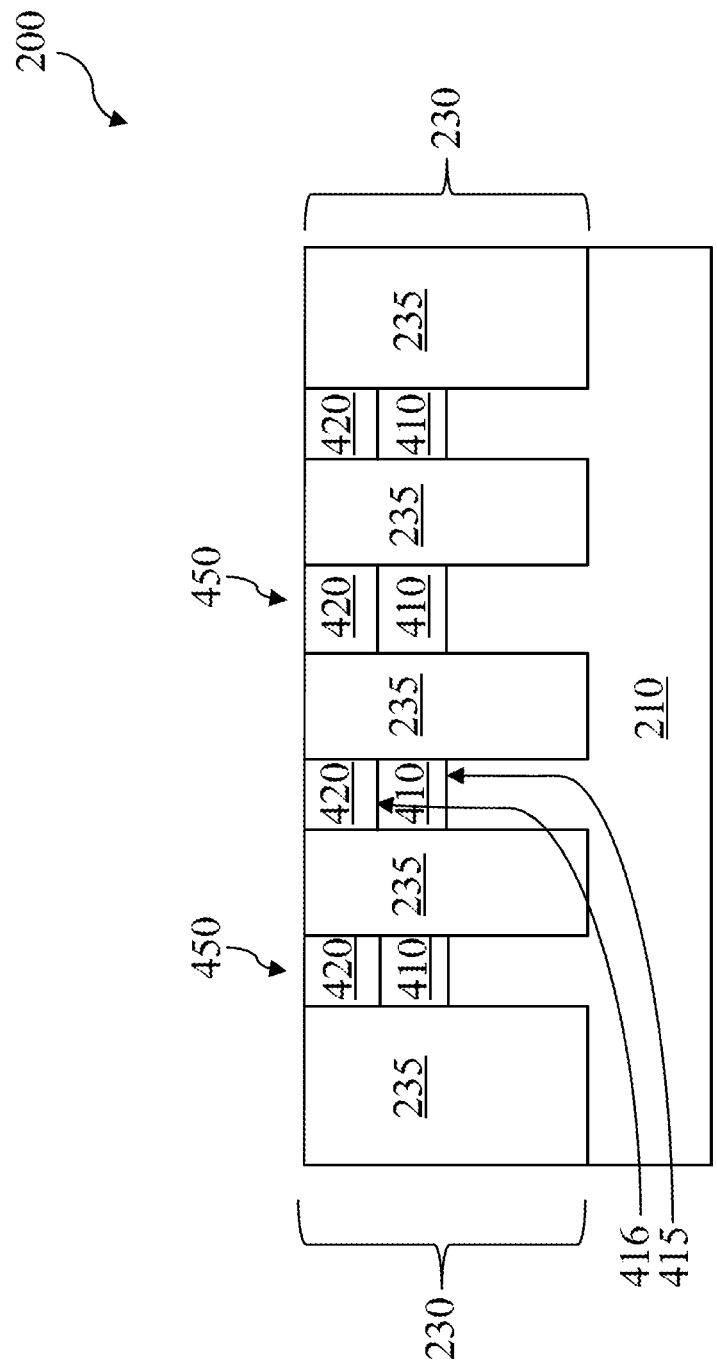

In another embodiment, the semiconductor material layer 410 partially fills in the third trenches 310 and a second semiconductor material layer 420 is deposited over the first semiconductor material 410. Therefor a second interface 416 is formed between two semiconductor material layers, as shown in FIG. 4B. Additionally, prior to depositing the second semiconductor layer 420, a recess process may be performed to etch the semiconductor layer 410 to achieve a desirable top surface profile. The recess process is similar in many respects to those discussed above in association with FIG. 3A. In yet another embodiment, a stack of multiple different semiconductor material layers is filled in the second trench 310. The depositing process of multiple semiconductor material layers is similar in many respects to those discussed above in association with FIG. 4A. The following disclosure will be directed to the embodiment of FIG. 4A, for the sake of example. It is understood that similar steps can be implemented on the embodiments of FIG. 4B.

Figure 5:
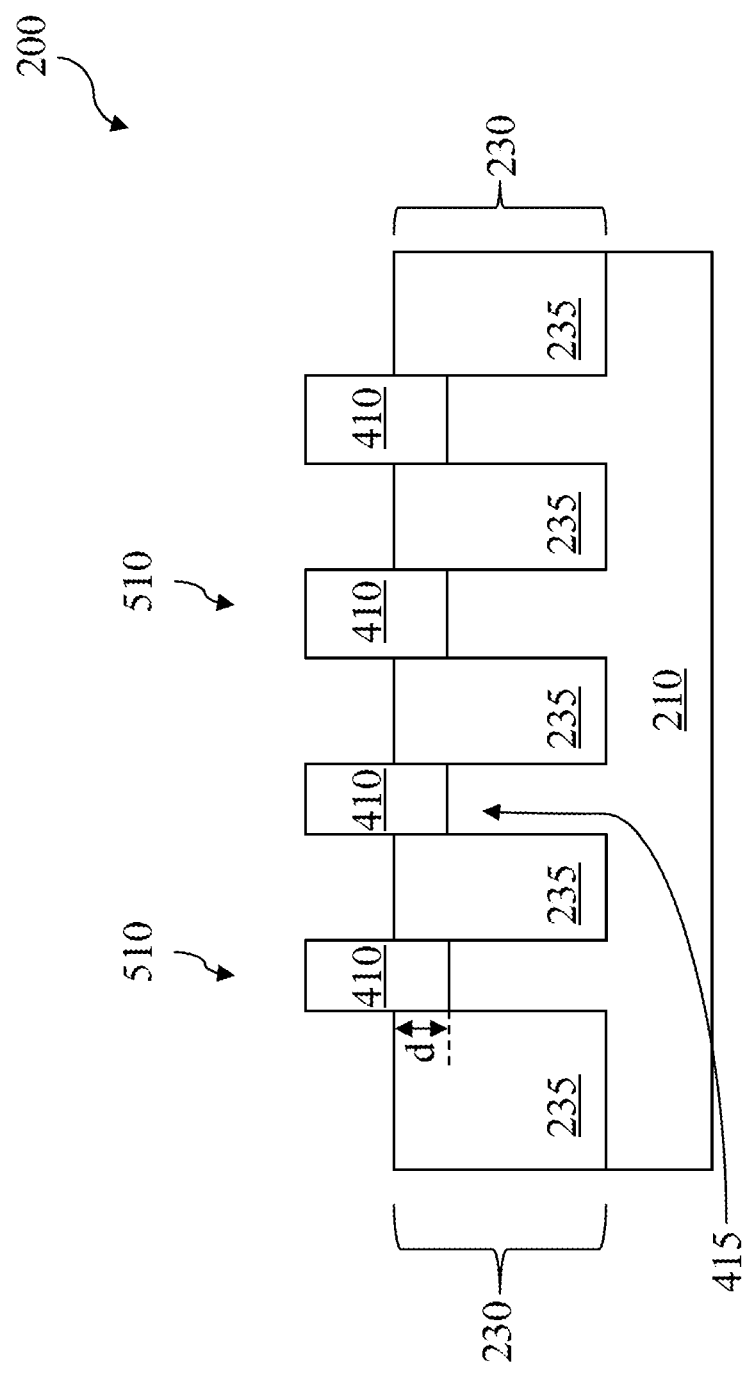

For a FinFET device 200, referring to FIGS. 1 and 5, the method 100 proceeds to an extra step 108. Referring to FIGS. 1 and 5-6, the method 100 proceeds to step 108 by recessing the dielectric layer 235 around the semiconductor material layers 410 to laterally expose an upper portion of the semiconductor material layer 410, thereby to form third fins 510. The recessing process may include dry etching process, wet etching process, and/or combination thereof. In the present embodiment, a depth of the recessing is controlled that a top surface of the dielectric layer 235 remains above the interface 415 with a distance d. In another embodiment, the top surface of the dielectric layer 235 is at a same horizontal level of the interface 415. Thus the third fin 510 is formed as a stack of layers, 410, the interface 415 and the substrate 210 (in an order from top to bottom). The stack of layers may induce strain in the third fin 510. A portion of the third fin 510 is to be defined as source/drain regions 530 while another portion is to be defined as a gate region 540. The source/drain regions 530 are separated by the gate region 540, as shown in FIG. 6.

Alternatively, for a planar device 200, the method 100 skips the step 208. The following disclosure will be directed to the embodiment of the FinFET device 200 of FIGS. 5 and 6, for the sake of example. It is understood that similar steps can be implemented on the embodiment of a planar device 200.

Referring to FIGS. 1 and 7A-7B, the method 100 proceeds to step 110 by converting the interface 415 to a semiconductor oxide layer 615. A profile of the semiconductor oxide layer 615 may be substantially similar to the profile of the interface 415. The semiconductor oxide layer 615 is located below the top surface of the dielectric layer 235 with the distance d. In one embodiment, the interface 415 is fully converted to the semiconductor oxide layer 615, referred to as a fully conversion, as shown in FIG. 7A. In another embodiment, a portion of the interface 415 is converted to the semiconductor oxide layer 615, referred to as a partial conversion, as shown in FIG. 7B. In the partial conversion, an outer portion of the interface 415 converts to the semiconductor oxide layer 615 while a center portion remains. For example, a Si/SiGe$_x$ interface 415 converts to a SiGeO$_y$ layer 615, where y is oxygen composition in atomic percent, in a full conversion. For another example, an outer portion of the Si/SiGe$_x$ interface 415 converts to a SiGeO$_y$ layer 615, where y is oxygen composition in atomic percent, while Si/SiGe$_x$ interface 415 remains as a center portion.

The conversion (partial or full) may be achieved by various plasma treatments, such as an O$_2$ plasma ashing process. A targeted scale of the conversion (from partial to full conversion) may be achieved adjusting process parameters of the plasma treatment, such as time, power and gas flows. The conversion (partial or full) may also be achieved by annealing processes including a rapid thermal anneal (RTA), a laser anneal, a flash lamp anneal and furnace anneal. A targeted scale of the conversion (from partial to full conversion) may be achieved adjusting process parameters of the annealing process, such as temperature and annealing time.

In one embodiment, the conversion of the interface 415 to the semiconductor oxide layer 615 is achieved by a dedicated process to gain a better process control of the scale of the conversion. In another embodiment, the conversion is achieved during a downstream thermal process to gain process simplicity.

The following disclosure will be directed to the embodiment of FIG. 7A, for the sake of example. It is understood that similar steps can be implemented on the embodiments of FIG. 7A.

Referring to FIGS. 8A-8B and 9, the IC device 200 may undergo further CMOS or MOS technology processing to form various features and regions known in the art. In one embodiment, the IC device 200 is a FinFET device, as shown in FIGS. 8A-8B. In another embodiment, the IC device is a planar device, as shown in FIG. 9.

The IC device 200 may include a high-k (HK)/metal gate (MG) 710 over the substrate 210. For the FinFET device 200, the HK/MG 710 may wrap over a portion of the third fin 510 in the gate region 540, where the third fin 510 may serve as gate channel region. Alternatively, for the planar device 200, the HK/MG 710 is formed over the second fin 450, where an upper portion of the semiconductor material layer 410 may serve as gate channel region.

An interfacial layer (IL) 712 is deposited by any appropriate method, such as ALD, CVD and ozone oxidation. The IL 712 includes oxide, HfSiO and oxynitride. A HK dielectric layer 714 is deposited over the IL 712 by suitable techniques, such as ALD, CVD, metal-organic CVD (MOCVD), PVD, thermal oxidation, combinations thereof, or other suitable techniques. The HK dielectric layer 924 may include LaO, AlO, ZrO, TiO, Ta2O5, Y2O3, SrTiO3 (STO), BaTiO3 (BTO), BaZrO, HfZrO, HfLaO, HfSiO, LaSiO, AlSiO, HfTaO, HfTiO, (Ba,Sr)TiO3 (BST), Al2O3, Si3N4, oxynitrides (SiON), or other suitable materials.

A metal gate (MG) layer 716 may include a single layer or multi layers, such as metal layer, liner layer, wetting layer, and adhesion layer. The MG layer 716 may include Ti, Ag, Al, TiAlN, TaC, TaCN, TaSiN, Mn, Zr, TiN, TaN, Ru, Mo, Al, WN, Cu, W, or any suitable materials. The MG layer 716 may be formed by ALD, PVD, CVD, or other suitable process. The MG layer 716 may be formed separately for the N-FET and P-FFET with different metal layers.

In a gate first process, the HK/MG 710 is all or part of a functional gate. Conversely, in a gate last process, a dummy gate is formed first and is replaced later by the HK/MG 710 after high thermal temperature processes are performed, such as thermal processes during sources/drains formation.

The IC device 200 may also include sidewall spacers 720 made by dielectric materials such as silicon oxide, silicon nitride, silicon carbide, silicon oxynitride, or combinations thereof. The sidewall spacers 720 may include a multiple layers. Typical formation methods for the sidewall spacers 720 include deposition and anisotropically etch back.

The IC device 200 may also include an interlayer dielectric (ILD) layer 730 formed between the HK/MG 710 over the substrate 210. The ILD layer 730 includes silicon oxide, oxynitride or other suitable materials. The ILD layer 730 includes a single layer or multiple layers. The ILD layer 730 is formed by a suitable technique, such as CVD, ALD and spin-on (SOG). A chemical mechanical polishing (CMP) process may be performed to remove excessive ILD layer 730 and planarize the top surface of the ILD layer 730 with the top surface of the HK/MG 710.

The IC device 200 may also include a source/drain feature 740 in the source/drain regions 530. As an example, a portion of the third fins 510 in the source/drain regions 530 is recessed. The recessing process may include dry etching process, wet etching process, and/or combination thereof. The recessing process may also include a selective wet etch or a selective dry etch. The recessing process may include multiple etching processes. Then, a second semiconductor material 750 epitaxially grows in the recessed third fin 510 to form the source/drain feature 740. The second semiconductor material 750 includes Ge, Si, GaAs, AlGaAs, SiGe, GaAsP, or other suitable material. The source/drain feature 740 may be formed by one or more epitaxy or epitaxial (epi) processes. The source/drain features 740 may be in-situ doped during the epi process. For example, the epitaxially grown SiGe source/drain features 740 may be doped with boron; and the epitaxially grown Si epi source/drain features 740 may be doped with carbon to form Si:C source/drain features, phosphorous to form Si:P source/drain features, or both carbon and phosphorous to form SiCP source/drain features. In one embodiment, the source/drain features 740 are not in-situ doped, an implantation process (i.e., a junction implant process) is performed to dope the source/drain features 740.

The IC device 200 may undergo further CMOS or MOS technology processing to form various features and regions known in the art. For example, subsequent processing may form various contacts/vias/lines and multilayers interconnect features (e.g., metal layers and interlayer dielectrics) over the substrate 210, configured to connect the various features or structures of the IC device 200. For example, a multilayer interconnection includes vertical interconnects, such as conventional vias or contacts, and horizontal interconnects, such as metal lines. The various interconnection features may implement various conductive materials including copper, tungsten, and/or silicide. In one example, a damascene and/or dual damascene process is used to form a copper related multilayer interconnection structure.

Additional steps can be provided before, during, and after the method 100, and some of the steps described can be replaced or eliminated for other embodiments of the method.

Based on the above, the present disclosure offers a semiconductor device employing a strained gate channel region having a semiconductor oxide layer between two different semiconductor materials. It is believed that by converting an interface of the two different semiconductor materials to the semiconductor oxide layer reduces misfits and defect dramatically in the strained gate channel region and results in sub threshold leakage reduction.

The present disclosure provides many different embodiments of a semiconductor device. The semiconductor device includes a substrate having a gate region, a fin structure disposed over the substrate in the gate region. The fin structure includes a first semiconductor material layer as a lower portion of the fin structure, a semiconductor oxide layer as a middle portion of the fin structure and a second semiconductor material layer as an upper portion of the fin structure. The semiconductor device also includes a dielectric feature disposed between two adjacent fin structures over the substrate. A top surface of the dielectric feature located, in a horizontal level, higher than the semiconductor oxide layer with a distance. The semiconductor device also includes a high-k (HK)/metal gate (MG) stack disposed in the gate region, including wrapping over a portion of the fin structure.

In another embodiment, a semiconductor device includes a substrate a substrate, a fin structure disposed over the substrate. The fin structure includes a first semiconductor material layer as a lower portion of the fin structure, a semiconductor oxide layer as a middle portion of the fin structure and a second semiconductor material layer as an upper portion of the fin structure. The semiconductor device also includes a dielectric feature disposed between two adjacent fin structures over the substrate. A top surface of the dielectric feature located, in a horizontal level, higher than the semiconductor oxide layer with a distance. The semiconductor device also includes a high-k (HK)/metal gate (MG) stack disposed over the fin structure.

In yet another embodiment, a method for fabricating a semiconductor device includes providing a substrate providing a substrate. The substrate includes first fins having a gate region, source and drain regions separated by the gate region. The substrate also includes dielectric features between adjacent the first fins. The method also includes recessing the first fins and achieving a desired bottom profile, epitaxially growing a semiconductor material layer on the recessed first fins having an interface of the recessed fin and the semiconductor material, etching the dielectric feature to laterally expose an upper portion of the semiconductor material to form a second fin. A top surface of dielectric feature is above the interface. The method also includes converting the interface to a semiconductor oxide layer and forming a high-k/metal gate (HK/MG) stack over the substrate, including wrapping over a portion of the second fin.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
   a substrate having a gate region;
   a fin structure disposed over the substrate in the gate region, the fin structure including:
   a first semiconductor material layer as a lower portion of the fin structure;
   a semiconductor oxide layer as a middle portion of the fin structure; and
   a second semiconductor material layer as an upper portion of the fin structure;
   a dielectric feature disposed between two adjacent fin structures over the substrate, wherein a top surface of the dielectric feature is located, in a horizontal level, higher than the semiconductor oxide layer with a distance d; and
   a metal gate (MG) stack disposed in the gate region, including wrapping over a portion of the fin structure, wherein the MG stack includes a gate dielectric layer wrapping over opposing sidewalls of the fin structure without physically contacting the semiconductor oxide layer.

2. The semiconductor device of claim 1, wherein the first semiconductor material layer includes silicon (Si).

3. The semiconductor device of claim 1, wherein the second semiconductor material layer includes epitaxially grown silicon germanium ($SiGe_x$), where x is Ge composition in atomic percent.

4. The semiconductor device of claim 1, wherein the semiconductor oxide layer includes silicon germanium oxide ($SiGeO_y$) layer, where y is oxygen composition in atomic percent.

5. The semiconductor device of claim 1, wherein the semiconductor oxide layer has a profile from the group consisting of flat, v-shape, carrot-shape, concave, convex and wave profile.

6. The semiconductor device of claim 1, wherein the semiconductor oxide layer has a center portion and an outer portion, wherein the center portion includes an interface of the first and second semiconductor material while the outer portion includes the semiconductor oxide layer.

7. The semiconductor device of claim 1, the fin structure further includes a third semiconductor material disposed over the second semiconductor material.

8. The semiconductor device of claim 7, wherein a second semiconductor oxide layer is disposed between the third and second semiconductor materials.

9. semiconductor device of claim 1, wherein the gate dielectric layer includes an interfacial dielectric layer.

10. A semiconductor device comprising:
   a substrate;
   a fin structure disposed over the substrate, the fin structure including:

a first semiconductor material layer as a lower portion of the fin structure;

a semiconductor oxide layer as a middle portion of the fin structure; and a second semiconductor material layer as an upper portion of the fin structure;

a dielectric feature disposed between two adjacent fin structures over the substrate, wherein a top surface of the dielectric feature located, in a horizontal level, higher than the semiconductor oxide layer with a distance d; and a metal gate (MG) stack disposed over the fin structure, wherein the MG stack includes a gate dielectric layer wrapping over opposing sidewalls of the fin structure without physically contacting the semiconductor oxide layer.

11. The semiconductor device of claim 10, wherein the first semiconductor material layer includes silicon (Si).

12. The semiconductor device of claim 10, wherein the second semiconductor material layer includes epitaxially grown silicon germanium ($SiGe_x$), where x is Ge composition in atomic percent.

13. The semiconductor device of claim 10, wherein the semiconductor oxide layer includes silicon germanium oxide ($SiGeO_y$) layer, where y is oxygen composition in atomic percent.

14. The semiconductor device of claim 10, wherein the semiconductor oxide layer has a profile from the group consisting of flat, v-shape, carrot-shape, concave, convex and wave profile.

15. The semiconductor device of claim 10, wherein the semiconductor oxide layer has a center portion and an outer portion, wherein the center portion includes an interface of the first and second semiconductor material while the outer portion includes the semiconductor oxide layer.

16. The semiconductor device of claim 10, the fin structure further includes a third semiconductor material disposed over the second semiconductor material.

17. The semiconductor device of claim 16, wherein a second semiconductor oxide layer is disposed between the third and second semiconductor materials.

18. semiconductor device of claim 10, wherein the gate dielectric layer includes an interfacial dielectric layer.

19. A method for fabricating a semiconductor device, the method comprising:

providing a substrate, the substrate including:

a first fin having a gate region, source and drain regions separated by the gate region; and a dielectric feature between the first fin and another fin on the substrate;

recessing the first fin to achieve a desired bottom profile;

epitaxially growing a semiconductor material layer on the recessed first fin having an interface of the recessed first fin and the semiconductor material layer;

etching the dielectric feature to laterally expose an upper portion of the semiconductor material to form a second fin, wherein a top surface of dielectric feature is above the interface;

converting the interface to a semiconductor oxide layer; and forming a high-k/metal gate (HK/MG) stack over the substrate, including wrapping over a portion of the second fin.

20. The method of claim 19, wherein the bottom profile is formed from the group consisting of flat, v-shape, carrot-shape, concave, convex and wave profile.

21. The method of claim 19, wherein the interface is converted to the semiconductor oxide layer by oxygen plasma ashing.

22. The method of claim 19, wherein the interface is converted to the semiconductor oxide layer by thermal anneal.

23. The method of claim 19, wherein the interface is fully converted to the semiconductor oxide layer.

24. The method of claim 19, wherein the interface is partially converted to the semiconductor oxide layer.

* * * * *